(12) United States Patent
Shi et al.

(10) Patent No.: US 12,433,131 B2
(45) Date of Patent: Sep. 30, 2025

(54) FOLDABLE DISPLAY MODULE AND DISPLAY DEVICE

(71) Applicant: BOE TECHNOLOGY GROUP CO., LTD., Beijing (CN)

(72) Inventors: Shiming Shi, Beijing (CN); Zhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 879 days.

(21) Appl. No.: 17/630,230

(22) PCT Filed: Apr. 9, 2021

(86) PCT No.: PCT/CN2021/086175
§ 371 (c)(1),
(2) Date: Jan. 26, 2022

(87) PCT Pub. No.: WO2021/238442
PCT Pub. Date: Dec. 2, 2021

(65) Prior Publication Data
US 2022/0285450 A1 Sep. 8, 2022

(30) Foreign Application Priority Data
May 26, 2020 (CN) .......................... 202010455934.X

(51) Int. Cl.
H01L 27/32 (2006.01)
H10K 50/84 (2023.01)
H10K 59/40 (2023.01)
H10K 59/80 (2023.01)
G02B 5/30 (2006.01)
(Continued)

(52) U.S. Cl.
CPC ........... *H10K 59/40* (2023.02); *H10K 50/841* (2023.02); *H10K 59/871* (2023.02); *G02B 5/3025* (2013.01); *G06F 3/044* (2013.01); *G06F 2203/04102* (2013.01); *H10K 50/868* (2023.02);
(Continued)

(58) Field of Classification Search
None
See application file for complete search history.

(56) References Cited

U.S. PATENT DOCUMENTS

2015/0146140 A1* 5/2015 Saneto .................. G02B 1/105
428/339
2015/0301403 A1* 10/2015 Oba ..................... G02B 5/3033
428/1.31
(Continued)

*Primary Examiner* — Anthony J Frost
(74) *Attorney, Agent, or Firm* — HOUTTEMAN LAW LLC

(57) ABSTRACT

Provided is a foldable display module, including: a bendable display panel; a touch structure layer disposed on a light-emitting side of the bendable display panel; a cover film layer including a first cover layer and a second cover layer disposed on a side of the first cover layer (349 away from the bendable display panel; and a plurality of organic film layers including at least one organic bonding layer and at least one structural functional layer, with the at least one organic bonding layer including a first optical adhesive layer, the at least one structural functional layer including at least one of a circular polarizer and a back film, the circular polarizer being located between the touch structure layer and the bendable display panel, and the back film being located on a backlight side of the bendable display panel.

20 Claims, 1 Drawing Sheet

(51) Int. Cl.
*G06F 3/044* (2006.01)
*H10K 50/80* (2023.01)
*H10K 77/10* (2023.01)
*H10K 102/00* (2023.01)

(52) U.S. Cl.
CPC ...... *H10K 77/111* (2023.02); *H10K 2102/311* (2023.02); *H10K 2102/351* (2023.02)

(56) References Cited

U.S. PATENT DOCUMENTS

| | | | |
|---|---|---|---|
| 2015/0346408 A1* | 12/2015 | Mizutani | B32B 37/26 |
| | | | 428/41.5 |
| 2017/0205659 A1* | 7/2017 | Chien | G02F 1/133308 |
| 2018/0315953 A1* | 11/2018 | Hu | B32B 27/281 |
| 2019/0086709 A1* | 3/2019 | Lee | G02F 1/133308 |

\* cited by examiner

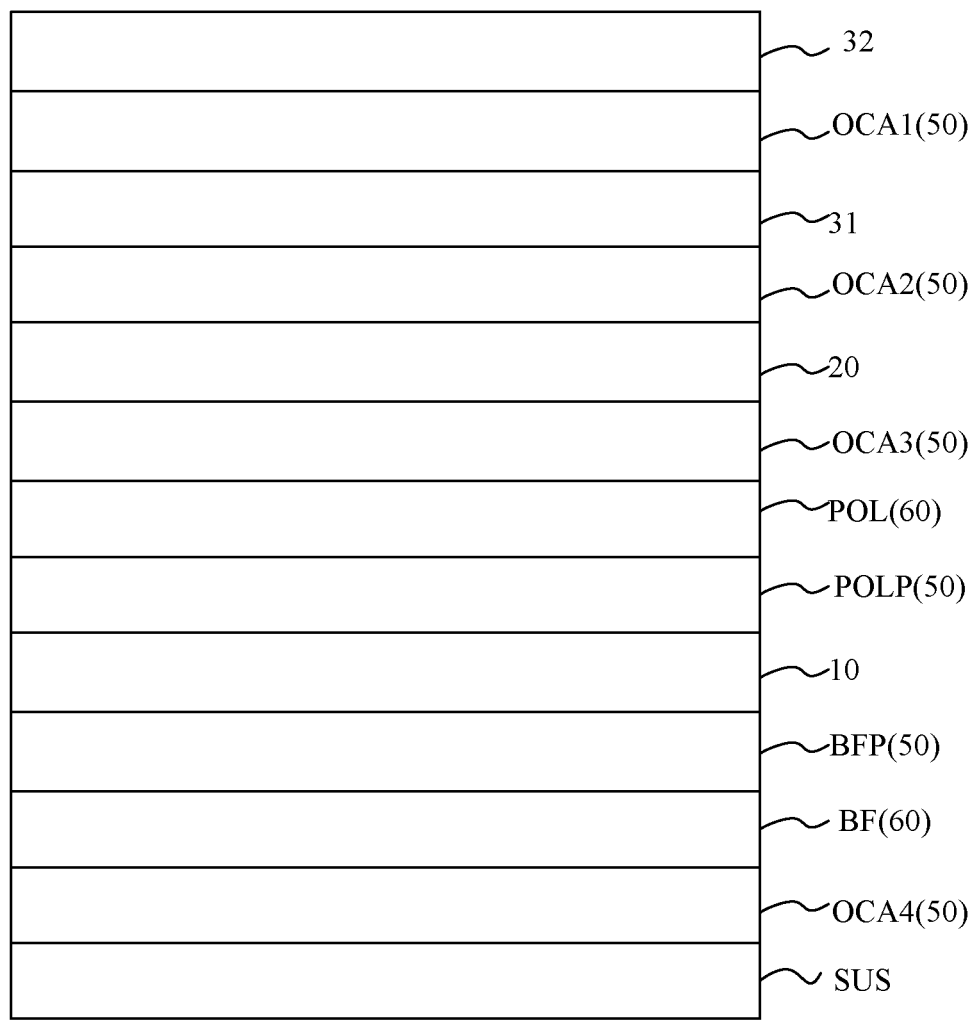

FOLDABLE DISPLAY MODULE AND DISPLAY DEVICE

TECHNICAL FIELD

The present disclosure relates to the field of display technology, and in particular, to a foldable display module and a display device.

BACKGROUND

With a huge leap forward of flexible screen technology, forms of display devices become more and more abundant, and foldable display modules have become an important development direction in recent display field. The existing foldable display module cannot be easily restored to flatness after being folded for many times.

SUMMARY

In order to solve at least one of the technical problems in the prior art, the present disclosure provides a foldable display module and a display device.

In order to achieve the above objective, the present disclosure provides a foldable display module, including:
- a bendable display panel;
- a touch structure layer disposed on a light-emitting side of the bendable display panel;
- a cover film layer disposed on a side of the touch structure layer away from the bendable display panel and including a first cover layer and a second cover layer disposed on a side of the first cover layer away from the bendable display panel, an elastic modulus of the first cover layer being greater than that of the second cover layer at a same temperature; and
- a plurality of organic film layers including at least one organic bonding layer and at least one structural functional layer, with the at least one organic bonding layer including a first optical adhesive layer bonded between the first cover layer and the second cover layer, the at least one structural functional layer including at least one of a circular polarizer or a back film, the circular polarizer being located between the touch structure layer and the bendable display panel, and the back film being located on a backlight side of the bendable display panel.

For each organic bonding layer, an elastic modulus of the organic bonding layer at −30° C. is 1.3 to 35 times that of the organic bonding layer at 20° C., and is 2 to 140 times that of the organic bonding layer at 60° C.; and
in a temperature range of −30° C. to 60° C., an elastic modulus of the structural functional layer is greater than 1 GPa.

In some implementations, the first cover layer includes flexible glass, and an elastic modulus of the first cover layer is between 60 GPa and 80 GPa in the temperature range of −30° C. to 60° C.

In some implementations, an elastic modulus of the second cover layer is between 5 GPa and 8 GPa in the temperature range of −30° C. to 60° C.

In some implementations, a thickness of the first cover layer is between 50 μm and 80 μm, and a thickness of the second cover layer is between 80 μm and 90 μm.

In some implementations, an elastic modulus of the first optical adhesive layer at −30° C. is 15 to 35 times that of the first optical adhesive layer at 20° C., and is 20 to 140 times that of the first optical adhesive layer at 60° C.

In some implementations, the elastic modulus of the first optical adhesive layer at −30° C. is between 600 KPa and 700 KPa;
the elastic modulus of the first optical adhesive layer at 20° C. is between 20 KPa and 40 KPa; and
the elastic modulus of the first optical adhesive layer at 60° C. is between 5 KPa and 25 KPa.

In some implementations, a thickness of the first optical adhesive layer is between 50 μm and 60 μm.

In some implementations, the at least one organic bonding layer further includes:
a second optical adhesive layer bonded between the touch structure layer and the first cover layer; and
an elastic modulus of the second optical adhesive layer at −30° C. is 1.3 to 3 times that of the second optical adhesive layer at 20° C., and is 2 to 6 times that of the second optical adhesive layer at 60° C.

In some implementations, the elastic modulus of the second optical adhesive layer at −30° C. is between 80 KPa and 120 KPa; the elastic modulus of the second optical adhesive layer at 20° C. is between 40 KPa and 60 KPa; and the elastic modulus of the second optical adhesive layer at 60° C. is between 20 KPa and 40 KPa.

In some implementations, a thickness of the second optical adhesive layer is between 50 μm and 60 μm.

In some implementations, the at least one structural functional layer includes the circular polarizer, and the at least one organic bonding layer further includes:
a polarizer bonding layer bonded between the circular polarizer and the bendable display panel; and
a third optical adhesive layer bonded between the touch structure layer and the circular polarizer.

In the temperature range of −30° C. to 60° C., a change rate of an elastic modulus of the circular polarizer is less than 10%, and the elastic modulus of the circular polarizer is between 2 GPa and 4 GPa;
an elastic modulus of the polarizer bonding layer at −30° C. is 15 to 25 times that of the polarizer bonding layer at 20° C., and is 20 to 40 times that of the polarizer bonding layer at 60° C.; and
an elastic modulus of the third optical adhesive layer at −30° C. is 15 to 25 times that of the third optical adhesive layer at 20° C., and is 20 to 40 times that of the third optical adhesive layer at 60° C.

In some implementations, the elastic modulus of the polarizer bonding layer at −30° C. is between 1800 KPa and 2200 KPa, and the elastic modulus of the third optical adhesive layer at −30° C. is between 2000 KPa and 2400 KPa;
the elastic modulus of the polarizer bonding layer at 20° C. and that of the third optical adhesive layer at 20° C. are both between 100 KPa and 120 KPa; and
the elastic modulus of the polarizer bonding layer at 60° C. and that of the third optical adhesive layer at 60° C. are both between 60 KPa and 80 KPa.

In some implementations, a thickness of the circular polarizer is between 50 μm and 80 μm; a thickness of the polarizer bonding layer is between 10 μm and 15 μm; and a thickness of the third optical adhesive layer is between 20 μm and 30 μm.

In some implementations, the at least one structural functional layer includes the back film, the foldable display module further includes a support layer located on a side of the back film away from the bendable display panel, and the at least one organic bonding layer further includes:
a back film bonding layer bonded between the back film and the bendable display panel; and a fourth optical adhesive layer bonded between the back film and the support layer.

The support layer includes a stainless steel sheet, and an elastic modulus of the support layer is between 180 GPa and 220 GPa in the temperature range of −30° C. to 60° C.;

in the temperature range of −30° C. to 60° C., a change rate of an elastic modulus of the back film is less than 10%, and the elastic modulus of the back film is between 2.5 GPa and 3 GPa;

an elastic modulus of the back film bonding layer at −30° C. is 15 to 35 times that of the back film bonding layer at 20° C., and is 20 to 140 times that of the back film bonding layer at 60° C.; and an elastic modulus of the fourth optical adhesive layer at −30° C. is 15 to 35 times that of the fourth optical adhesive layer at 20° C., and is 20 to 140 times that of the fourth optical adhesive layer at 60° C.

In some implementations, the elastic modulus of the back film bonding layer at −30° C. and that of the fourth optical adhesive layer at −30° C. are both between 600 KPa and 700 KPa;

the elastic modulus of the back film bonding layer at 20° C. and that of the fourth optical adhesive layer at 20° C. are both between 20 KPa and 40 KPa; and the elastic modulus of the back film bonding layer at 60° C. and that of the fourth optical adhesive layer at 60° C. are both between 5 KPa and 25 KPa.

In some implementations, a thickness of the support layer is between 30 μm and 40 μm, a thickness of the back film is between 25 μm and 50 μm, a thickness of the back film bonding layer is between 25 μm and 30 μm, and a thickness of the fourth optical adhesive layer is between 50 μm and 60 μm.

In some implementations, the touch structure layer includes:

a touch substrate; and touch electrodes disposed on the touch substrate.

In the temperature range of −30° C. to 60° C., a change rate of an elastic modulus of the touch substrate is less than 10%, and the elastic modulus of the touch substrate is between 3 GPa and 5 GPa; and a thickness of the touch substrate is between 20 μm and 30 μm.

An embodiment of the present disclosure further provides a display device, which includes the foldable display module described in the above embodiments.

BRIEF DESCRIPTION OF DRAWINGS

The accompanying drawings are intended to provide a further understanding of the present disclosure, and are incorporated in and constitute a part of the specification. The drawings are used to explain the present disclosure in conjunction of specific embodiments below, but do not constitute any limitation to the present disclosure. In the drawings:

FIG. 1 is a schematic diagram of a foldable display module according to embodiments of the present disclosure.

DETAIL DESCRIPTION OF EMBODIMENTS

The specific embodiments of the present disclosure are described in detail below with reference to the drawings. It should be understood that the specific embodiments described herein are merely used to illustrate and explain the present disclosure, rather than limiting the present disclosure.

In order to make the objectives, technical solutions and advantages of the present disclosure clearer, the technical solutions of the embodiments of the present disclosure are clearly and thoroughly described below in conjunction with the drawings. Apparently, the embodiments described herein are merely some embodiments of the present disclosure, and do not cover all embodiments. All other embodiments derived by those of ordinary skill in the art from the described embodiments of the present disclosure without inventive work fall within the scope of the present disclosure.

The terms used herein to describe the embodiments of the present disclosure are not intended to limit and/or define the scope of the present disclosure. For example, unless otherwise defined, the technical terms or scientific terms used herein should have general meanings that are understood by those of ordinary skill in the technical field of the present disclosure. It should be understood that the words "first", "second" and the like used herein do not denote any order, quantity or importance, but are just used to distinguish between different elements. Unless clearly stated in the text, the singular form "one", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

In the description below, when an element or layer is referred to as being "on" or "connected to" another element or layer, the element or layer may be directly on, or be directly connected to another element or layer, or an intermediate element or layer may be provided between the element or layer and another element and layer. However, when the element or layer is referred to as being "directly on" or "directly connected to" another element or layer, there is no intermediate element or layer. The term "and/or" includes one associated listed item or any and all combinations of one or more of the associated listed items.

In a foldable display module, a plurality of organic film layers are disposed at both a light exit side and a backlight side of a bendable display panel, and the organic film layers are very like to creep after being folded for a long time, which produces a result that the foldable display device cannot be restored to be completely flattened and a crease defect is caused. For example, when the foldable display module is restored from a folded state to an unfolded state, a large tilt angle appears at the crease.

The embodiments of the present disclosure provide a foldable display module. FIG. 1 is a schematic diagram of a foldable display module according to the embodiments of the present disclosure. As shown in FIG. 1, the foldable display module includes: a bendable display panel 10, a touch structure layer 20, a cover film layer and a plurality of organic film layers. The bendable display panel 10 may be an Organic Light-Emitting Diode (OLED) display panel 10. The touch structure layer 20 is disposed on a light-emitting side of the bendable display panel 10, and is configured to detect occurrence of touches. The cover film layer is disposed on a side of the touch structure layer 20 away from the bendable display panel 10. The cover film layer includes a first cover layer 31 and a second cover layer 32 disposed on a side of the first cover layer 31 away from the bendable display panel 10. An elastic modulus of the first cover layer 31 is greater than that of the second cover layer 32 at a same temperature, so that the crease defect is alleviated and flatness of the restored foldable display module is also improved after the foldable display module is folded for a plurality of times.

The plurality of organic film layers include at least one organic bonding layer 50 and at least one structural functional layer 60, the at least one organic bonding layer 50 includes a first optical adhesive layer OCA1 bonded between the first cover layer 31 and the second cover layer 32, and the at least one structural functional layer 60 includes: at least one of a circular polarizer POL and a back film BF, the circular polarizer POL is located between the touch structure layer 20 and the bendable display panel 10, and the back film BF is located on a backlight side of the bendable display panel 10. An elastic modulus of the structural functional layer 60 is greater than 1 GPa in a temperature range of −30° C. to 60° C. For each organic bonding layer 50, an elastic modulus of the organic bonding layer 50 at −30° C. is 1.3 to 35 times that of the organic bonding layer 50 at 20° C., and is 2 to 140 times that of the organic bonding layer 50 at 60° C.

In the implementations of the present disclosure, the organic film layers are film layers made of organic materials in the foldable display module, and may be divided into the organic bonding layer 50 and the structural functional layer 60, the organic bonding layer 50 performs a bonding function, the elastic modulus of the organic bonding layer 50 changes with the temperature, and the elastic modulus of the structural functional layer 60 in the temperature range from −30° C. to 60° C. is greater than 1 GPa. Such setting may facilitate restoration of the foldable display module to flatness and may also facilitate concentration of bending stress on the organic bonding layer or the structural functional layer when the foldable display module is folded, thereby preventing the display panel or the touch structure layer from being damaged.

In some implementations, the first cover layer 31 includes flexible glass (Ultra Thin Glass, UTG) having a thickness between 50 μm and 80 μm. In the temperature range of −30° C. to 60° C., the elastic modulus of the first cover layer 31 is between 60 GPa and 80 GPa (e.g., 70 GPa), so that the first cover layer 31 may provide rigid support for each organic film layer when the foldable display module is folded, thereby alleviating the crease defect and improving the flatness of the restored foldable display module after the foldable display module is folded for a plurality of times.

In some implementations, in the temperature range of −30° C. to 60° C., the elastic modulus of the second cover layer 32 is basically unchanged, for example, the elastic modulus of the second cover layer 32 is between 5 GPa and 8 GPa (e.g., 6.5 GPa). For example, the second cover layer 32 may be made of Polyimide (PI).

In some implementation, a thickness of the second cover layer 32 is between 80 μm and 90 μm.

In some implementation, a scratch-resistant layer (not shown) is coated on a surface of the second cover layer 32 away from a display panel, so as to prevent the foldable display module from being scratched.

In some In some implementation, the touch structure layer 20 includes a touch substrate, and touch electrodes disposed on the touch substrate. In some implementation, the touch substrate is made of an organic material. For example, the touch substrate is made of Polyimide (PI). The touch electrodes may be metal mesh electrodes made of a metal having high conductivity. The touch electrodes include touch driving electrodes and touch sensing electrodes, and touch capacitance is formed between the touch driving electrode and the touch sensing electrode, and the touch driving electrodes and the touch sensing electrodes may be arranged on the same side or on two sides of the touch substrate. The touch structure layer 20 may further include touch traces disposed on the touch substrate, and the touch traces are connected to the touch electrodes. The touch electrodes and the touch traces may be made of nano silver. Thicknesses of the touch electrodes and the touch traces are smaller than 1 μm, so that the touch electrodes and the touch traces do not affect folding.

For example, a thickness of the touch substrate is between 20 μm and 30 μm, and an elastic modulus of the touch substrate is basically unchanged in the temperature range of −30° C. to 60° C. The expression of "the elastic modulus is basically unchanged" in the embodiments of the present disclosure may refer to that a change rate of the elastic modulus is less than 10%, that is, a difference between the maximum value of the elastic modulus and the minimum value of the elastic modulus is less than 10% of the maximum value of the elastic modulus in the temperature range of −30° C. to 60° C. For example, the elastic modulus of the touch substrate is between 3 GPa and 5 GPa (e.g., 4 GPa) in the temperature range of −30° C. to 60° C.

In some implementation, the elastic modulus of the first optical adhesive layer OCA1 at −30° C. is 15 to 35 times that of the first optical adhesive layer OCA1 at 20° C., and is 20 to 140 times that of the first optical adhesive layer OCA1 at 60° C. For example, the elastic modulus of the first optical adhesive layer OCA1 at −30° C. is between 600 KPa and 700 KPa (e.g., 650 KPa); the elastic modulus of the first optical adhesive layer OCA1 at 20° C. is between 20 KPa and 40 KPa (e.g., 30 KPa); and the elastic modulus of the first optical adhesive layer OCA1 at 60° C. is between 5 KPa and 25 KPa (e.g., 15 KPa). For example, a thickness of the first optical adhesive layer OCA1 is between 50 μm and 60 μm.

In some implementations, the organic bonding layer 50 further includes: a second optical adhesive layer OCA2 bonded between the touch structure layer 20 and the first cover layer 31. Transmittance of the second optical adhesive layer OCA2 is greater than 85%. For example, the second optical adhesive layer OCA2 is made of an acrylic resin material.

For example, an elastic modulus of the second optical adhesive layer OCA2 at −30° C. is 1.3 to 3 times that of the second optical adhesive layer OCA2 at 20° C., and is 2 to 6 times that of the second optical adhesive layer OCA2 at 60° C.

For example, the elastic modulus of the second optical adhesive layer OCA2 at −30° C. is between 80 KPa and 120 KPa (e.g., 100 KPa), the elastic modulus of the second optical adhesive layer OCA2 at 20° C. is between 40 KPa and 60 KPa (e.g., 50 KPa), and the elastic modulus of the second optical adhesive layer OCA2 at 60° C. is between 20 KPa and 40 KPa (e.g., 30 KPa).

For example, a thickness of the second optical adhesive layer OCA2 is between 50 μm and 60 μm.

In some implementation, as shown in FIG. 1, the structural functional layer 60 in the foldable display module includes the circular polarizer POL and the back film BF, and the organic bonding layer 50 further includes: a polarizer bonding layer POLP, a third optical adhesive layer OCA3, and a back film bonding layer BFP.

For example, the circular polarizer POL includes a linear polarizer and a quarter-wave plate, and the circular polarizer POL is configured to reduce reflection of external ambient light, thereby improving a display effect of the foldable display module.

In some implementation, in the temperature range of −30° C. to 60° C., an elastic modulus of the circular polarizer POL is basically unchanged, for example, a change rate of the elastic modulus is less than 10%. The elastic modulus of the circular polarizer POL is between 2 GPa and 4 GPa (e.g., 3 GPa).

In some implementation, a thickness of the circular polarizer POL is between 50 μm and 80 μm.

The polarizer bonding layer POLP is bonded between the circular polarizer POL and the bendable display panelfoldable display panel 10.

In some implementation, an elastic modulus of the polarizer bonding layer POLP at −30° C. is 15 to 25 times that of the polarizer bonding layer POLP at 20° C., and is 20 to 40 times that of the polarizer bonding layer POLP at 60° C. For example, the elastic modulus of the polarizer bonding layer POLP at −30° C. is between 1800 KPa and 2200 KPa (e.g., 2000 KPa), the elastic modulus of the polarizer bonding layer POLP at 20° C. is between 100 KPa and 120 KPa (e.g., 110 KPa), and the elastic modulus of the polarizer bonding layer POLP at 60° C. is between 60 KPa and 80 KPa (e.g., 70 KPa).

In some implementation, a thickness of the polarizer bonding layer POLP is between 10 μm and 15 μm.

The third optical adhesive layer OCA3 is bonded between the touch structure layer 20 and the circular polarizer POL.

In some implementation, an elastic modulus of the third optical adhesive layer OCA3 at −30° C. is 15 to 25 times that of the third optical adhesive layer OCA3 at 20° C., and is 20 to 40 times that of the third optical adhesive layer OCA3 at 60° C.

For example, the elastic modulus of the third optical adhesive layer OCA3 at −30° C. is between 2000 KPa and 2400 KPa (e.g., 2200 KPa); the elastic modulus of the third optical adhesive layer OCA3 at 20° C. is between 100 KPa and 120 KPa (e.g., 110 KPa); and the elastic modulus of the third optical adhesive layer OCA3 at 60° C. is between 60 KPa and 80 KPa (e.g., 70 KPa).

For example, a thickness of the third optical adhesive layer OCA3 is between 20 μm and 30 μm.

The back film BF is located on the backlight side of the display panel 10, and performs a protective function on the bendable display panel 10. The back film bonding layer BFP is bonded between the back film BF and the bendable display panel 10. In some implementation, the polarizer bonding layer POLP, the back film bonding layer BFP, and the third optical adhesive layer OCA3 are all made of acrylic resin materials.

In some implementation, in the temperature range of −30° C. to 60° C., an elastic modulus of the back film BF is basically unchanged, for example, a change rate of the elastic modulus is less than 10%. The elastic modulus of the back film BF is between 2.5 GPa and 3 GPa (e.g., 2.7 GPa). In some implementation, a thickness of the back film BF is between 25 μm and 50 μm.

An elastic modulus of the back film bonding layer BFP at −30° C. is 15 to 35 times that of the back film bonding layer BFP at 20° C., and is 20 to 140 times that of the back film bonding layer BFP at 60° C. For example, the elastic modulus of the back film bonding layer BFP at −30° C. is between 600 KPa and 700 KPa (e.g., 650 KPa), the elastic modulus of the back film bonding layer BFP at 20° C. is between 20 KPa and 40 KPa (e.g., 30 KPa), and the elastic modulus of the back film bonding layer BFP at 60° C. is between 5 KPa and 25 KPa (e.g., 15 KPa).

For example, a thickness of the back film bonding layer BFP is between 25 μm and 30 μm.

In some implementation, the foldable display module further includes a support layer SUS located on a side of the back film BF away from the bendable display panelfoldable display panel 10. The organic bonding layer in the foldable display module further includes: a fourth optical adhesive layer OCA4 bonded between the back film BF and the support layer SUS. For example, the fourth optical adhesive layer OCA4 is made of an acrylic resin material.

The support layer SUS is made of an inorganic material, for example, the support layer SUS includes a stainless steel sheet. In the temperature range of −30° C. to 60° C., an elastic modulus of the support layer SUS is basically unchanged, and the elastic modulus of the support layer SUS is between 180 GPa and 220 GPa (e.g., 200 GPa). The support layer SUS may provide rigid support when the foldable display module is folded, so that the foldable display module may maintain good flatness after being folded for a plurality of times.

In some implementation, an elastic modulus of the fourth optical adhesive layer OCA4 at −30° C. is 15 to 35 times that of the fourth optical adhesive layer OCA4 at 20° C., and is 20 to 140 times that of the fourth optical adhesive layer OCA4 at 60° C.

For example, the elastic modulus of the fourth optical adhesive layer OCA4 at −30° C. is between 600 KPa and 700 KPa (e.g., 650 KPa); the elastic modulus of the fourth optical adhesive layer OCA4 at 20° C. is between 20 KPa and 40 KPa (e.g., 30 KPa); and the elastic modulus of the fourth optical adhesive layer OCA4 at 60° C. is between 5 KPa and 25 KPa (e.g., 15 KPa).

For example, a thickness of the fourth optical adhesive layer OCA4 is between 50 μm and 60 μm.

Through the above setting of the structural thickness and the elastic modulus of each film layer, the flatness of the foldable display module can be improved when the foldable display module is restored from the folded state to a flat state; moreover, the bending stress can be concentrated on the organic film layers when the foldable display module is folded, so as to keep the bendable display panel 10 or the touch structural layer 20 from breaking, thereby guaranteeing quality of the foldable display module.

An embodiment of the present disclosure further provides a display device, which includes the above foldable display module. The display device may be any product or component with a display function, such as electronic paper, a mobile phone, a tablet computer, a television, a monitor, a notebook computer, a digital photo frame and a navigator.

Since the flatness of the foldable display module is improved when the foldable display module is restored from the folded state to the flat state, and the bending stress is not concentrated on the bendable display panel 10, overall quality of the display device is improved.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A foldable display module, comprising:
a bendable display panel;
a touch structure layer disposed on a light-emitting side of the bendable display panel;
a cover film layer disposed on a side of the touch structure layer away from the bendable display panel and comprising a first cover layer and a second cover layer disposed on a side of the first cover layer away from the bendable display panel, an elastic modulus of the first cover layer being greater than that of the second cover layer at a same temperature; and
a plurality of organic film layers comprising at least one organic bonding layer and at least one structural functional layer, with the at least one organic bonding layer comprising a first optical adhesive layer bonded between the first cover layer and the second cover layer, the at least one structural functional layer comprising a circular polarizer and a back film, the circular polarizer being located between the touch structure layer and the bendable display panel, and the back film being located on a backlight side of the bendable display panel;
wherein, for each organic bonding layer, an elastic modulus of the organic bonding layer at −30° C. is 1.3 to 35 times that of the organic bonding layer at 20° C., and is 2 to 140 times that of the organic bonding layer at 60° C.; and
in a temperature range of −30° C. to 60° C., an elastic modulus of the structural functional layer is greater than 1 GPa; and wherein
in the temperature range of −30° C. to 60° C., a change rate of an elastic modulus of the circular polarizer is less than 10%, and the elastic modulus of the circular polarizer is between 2 GPa and 4 GPa; and
in the temperature range of −30° C. to 60° C., a change rate of an elastic modulus of the back film is less than 10%, and the elastic modulus of the back film is between 2.5 GPa and 3 GPa.

2. The foldable display module of claim 1, wherein the first cover layer comprises flexible glass, and an elastic modulus of the first cover layer is between 60 GPa and 80 GPa in the temperature range of −30° C. to 60° C.

3. The foldable display module of claim 1, wherein an elastic modulus of the second cover layer is between 5 GPa and 8 GPa in the temperature range of −30° C. to 60° C.

4. The foldable display module of claim 1, wherein a thickness of the first cover layer is between 50 μm and 80 μm, and a thickness of the second cover layer is between 80 μm and 90 μm.

5. The foldable display module of claim 1, wherein an elastic modulus of the first optical adhesive layer at −30° C. is 15 to 35 times that of the first optical adhesive layer at 20° C., and is 20 to 140 times that of the first optical adhesive layer at 60° C.

6. The foldable display module of claim 5, wherein the elastic modulus of the first optical adhesive layer at −30° C. is between 600 KPa and 700 KPa;
the elastic modulus of the first optical adhesive layer at 20° C. is between 20 KPa and 40 KPa; and
the elastic modulus of the first optical adhesive layer at 60° C. is between 5 KPa and 25 KPa.

7. The foldable display module of claim 1, wherein a thickness of the first optical adhesive layer is between 50 μm and 60 μm.

8. The foldable display module of claim 1, wherein the at least one organic bonding layer further comprises: a second optical adhesive layer bonded between the touch structure layer and the first cover layer; and
an elastic modulus of the second optical adhesive layer at −30° C. is 1.3 to 3 times that of the second optical adhesive layer at 20° C., and is 2 to 6 times that of the second optical adhesive layer at 60° C.

9. The foldable display module of claim 8, wherein the elastic modulus of the second optical adhesive layer at −30° C. is between 80 KPa and 120 KPa; the elastic modulus of the second optical adhesive layer at 20° C. is between 40 KPa and 60 KPa; and the elastic modulus of the second optical adhesive layer at 60° C. is between 20 KPa and 40 KPa.

10. The foldable display module of claim 9, wherein a thickness of the second optical adhesive layer is between 50 μm and 60 μm.

11. The foldable display module of claim 1, wherein the at least one structural functional layer comprises the circular polarizer, and the at least one organic bonding layer further comprises:
a polarizer bonding layer bonded between the circular polarizer and the bendable display panel; and
a third optical adhesive layer bonded between the touch structure layer and the circular polarizer;
wherein,
an elastic modulus of the polarizer bonding layer at −30° C. is 15 to 25 times that of the polarizer bonding layer at 20° C., and is 20 to 40 times that of the polarizer bonding layer at 60° C.; and
an elastic modulus of the third optical adhesive layer at −30° C. is 15 to 25 times that of the third optical adhesive layer at 20° C., and is 20 to 40 times that of the third optical adhesive layer at 60° C.

12. The foldable display module of claim 11, wherein the elastic modulus of the polarizer bonding layer at −30° C. is between 1800 KPa and 2200 KPa, and the elastic modulus of the third optical adhesive layer at −30° C. is between 2000 KPa and 2400 KPa;
the elastic modulus of the polarizer bonding layer at 20° C. and that of the third optical adhesive layer at 20° C. are both between 100 KPa and 120 KPa; and
the elastic modulus of the polarizer bonding layer at 60° C. and that of the third optical adhesive layer at 60° C. are both between 60 KPa and 80 KPa.

13. The foldable display module of claim 12, wherein a thickness of the circular polarizer is between 50 μm and 80 μm; a thickness of the polarizer bonding layer is between 10 μm and 15 μm; and a thickness of the third optical adhesive layer is between 20 μm and 30 μm.

14. The foldable display module of claim 1, wherein the at least one structural functional layer comprises the back film, the foldable display module further comprises a support layer located on a side of the back film away from the bendable display panel, and the at least one organic bonding layer further comprises:
a back film bonding layer bonded between the back film and the bendable display panel; and
a fourth optical adhesive layer bonded between the back film and the support layer;
wherein the support layer comprises a stainless steel sheet, and an elastic modulus of the support layer is between 180 GPa and 220 GPa in the temperature range of −30° C. to 60° C.;
an elastic modulus of the back film bonding layer at −30° C. is 15 to 35 times that of the back film bonding layer at 20° C., and is 20 to 140 times that of the back film bonding layer at 60° C.; and an elastic modulus of the fourth optical adhesive layer at −30° C. is 15 to 35 times that of the fourth optical adhesive layer at 20° C., and is 20 to 140 times that of the fourth optical adhesive layer at 60° C.

15. The foldable display module of claim 14, the elastic modulus of the back film bonding layer at −30° C. and that of the fourth optical adhesive layer at −30° C. are both between 600 KPa and 700 KPa;

the elastic modulus of the back film bonding layer at 20° C. and that of the fourth optical adhesive layer at 20° C. are both between 20 KPa and 40 KPa; and the elastic modulus of the back film bonding layer at 60° C. and that of the fourth optical adhesive layer at 60° C. are both between 5 KPa and 25 KPa.

16. The foldable display module of claim 14, wherein a thickness of the support layer is between 30 μm and 40 μm, a thickness of the back film is between 25 μm and 50 μm, a thickness of the back film bonding layer is between 25 μm and 30 μm, and a thickness of the fourth optical adhesive layer is between 50 μm and 60 μm.

17. The foldable display module of claim 1, wherein the touch structure layer comprises:

a touch substrate; and touch electrodes disposed on the touch substrate;

wherein, in the temperature range of −30° C. to 60° C., a change rate of an elastic modulus of the touch substrate is less than 10%, and the elastic modulus of the touch substrate is between 3 GPa and 5 GPa; and a thickness of the touch substrate is between 20 μm and 30 μm.

18. A display device, comprising the foldable display module of claim 1.

19. A display device, comprising the foldable display module of claim 2.

20. A display device, comprising the foldable display module of claim 3.

* * * * *